United States Patent [19]
Brede et al.

[11] Patent Number: 6,097,650
[45] Date of Patent: Aug. 1, 2000

[54] CIRCUIT APPARATUS FOR EVALUATING THE DATA CONTENT OF MEMORY CELLS

[75] Inventors: Rüdiger Brede, Höhenkirchen; Dominique Savignac, Ismaning, both of Germany

[73] Assignee: Siemens Aktiengesellschaft, Munich, Germany

[21] Appl. No.: 09/133,704

[22] Filed: Aug. 13, 1998

[30] Foreign Application Priority Data

Aug. 13, 1997 [DE] Germany .................. 197 35 137

[51] Int. Cl.[7] .................................................. G11C 7/00
[52] U.S. Cl. ............................................. 365/203; 365/205
[58] Field of Search ..................................... 365/203, 205

[56] References Cited

U.S. PATENT DOCUMENTS

| | | | |
|---|---|---|---|
| 5,010,523 | 4/1991 | Yamauchi | 365/205 |
| 5,222,038 | 6/1993 | Tsuchida et al. | 365/204 |
| 5,255,235 | 10/1993 | Miyatake | 365/210 |
| 5,862,089 | 1/1999 | Raad et al. | 365/203 |

FOREIGN PATENT DOCUMENTS

| | | |
|---|---|---|
| 0 350 860 A2 | 1/1990 | European Pat. Off. . |
| 0 703 585 A2 | 3/1996 | European Pat. Off. . |

OTHER PUBLICATIONS

Japanese Patent Abstract No. 58182192 (Sumio), dated Oct. 25, 1983.

*Primary Examiner*—David Nelms
*Assistant Examiner*—Connie C. Yoha
*Attorney, Agent, or Firm*—Herbert L. Lerner; Laurence A. Greenberg; Werner H. Stemer

[57] ABSTRACT

A circuit apparatus for evaluating a data content of memory cells of an integrated semiconductor memory, which memory cells are disposed along bit lines and word lines. The circuit apparatus has a voltage compensation device with voltage compensation elements which are connected for the purpose of voltage coupling of in each case two neighboring bit lines and which enable compensation for a capacitive coupling between the bit lines.

11 Claims, 6 Drawing Sheets

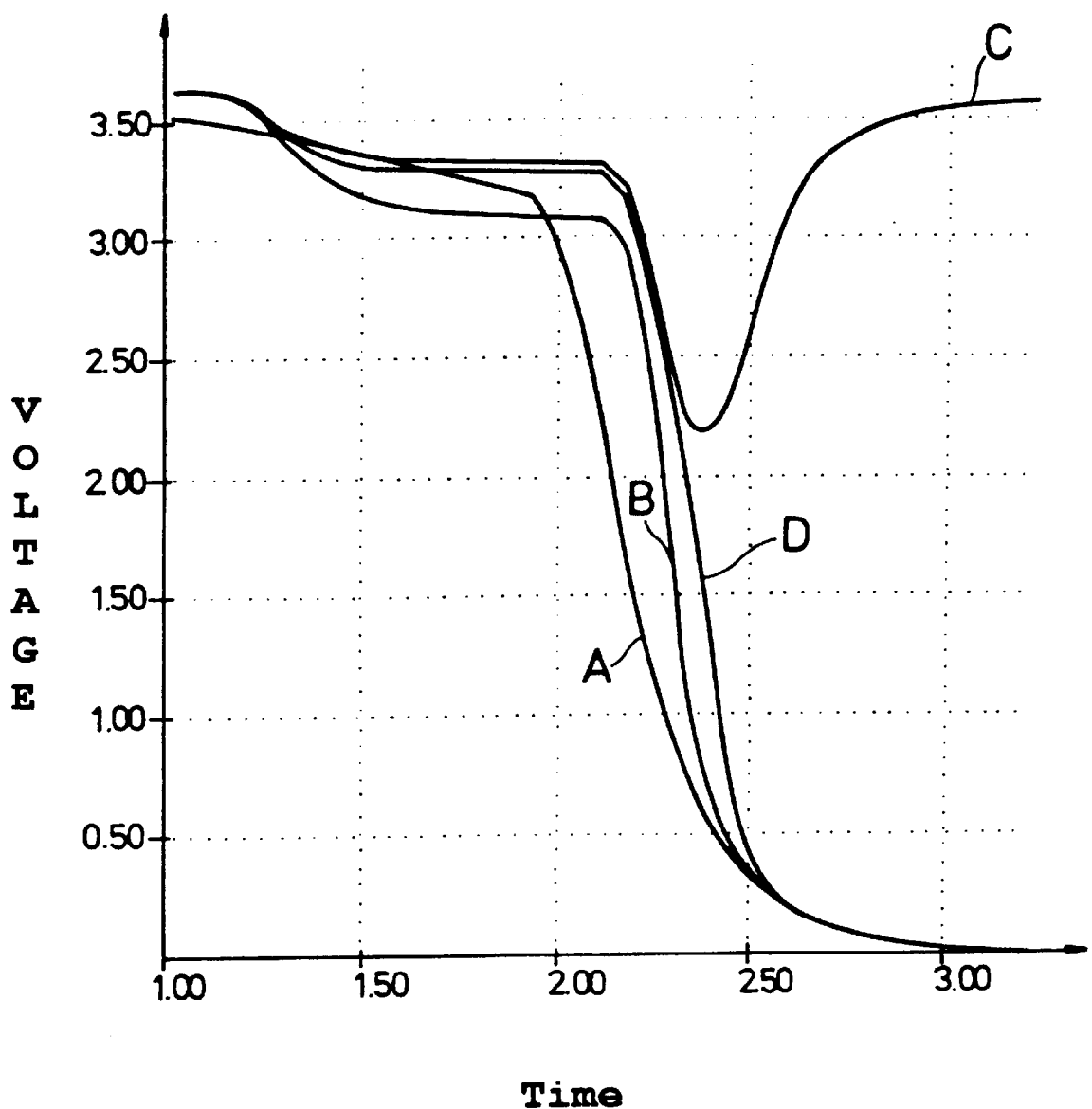

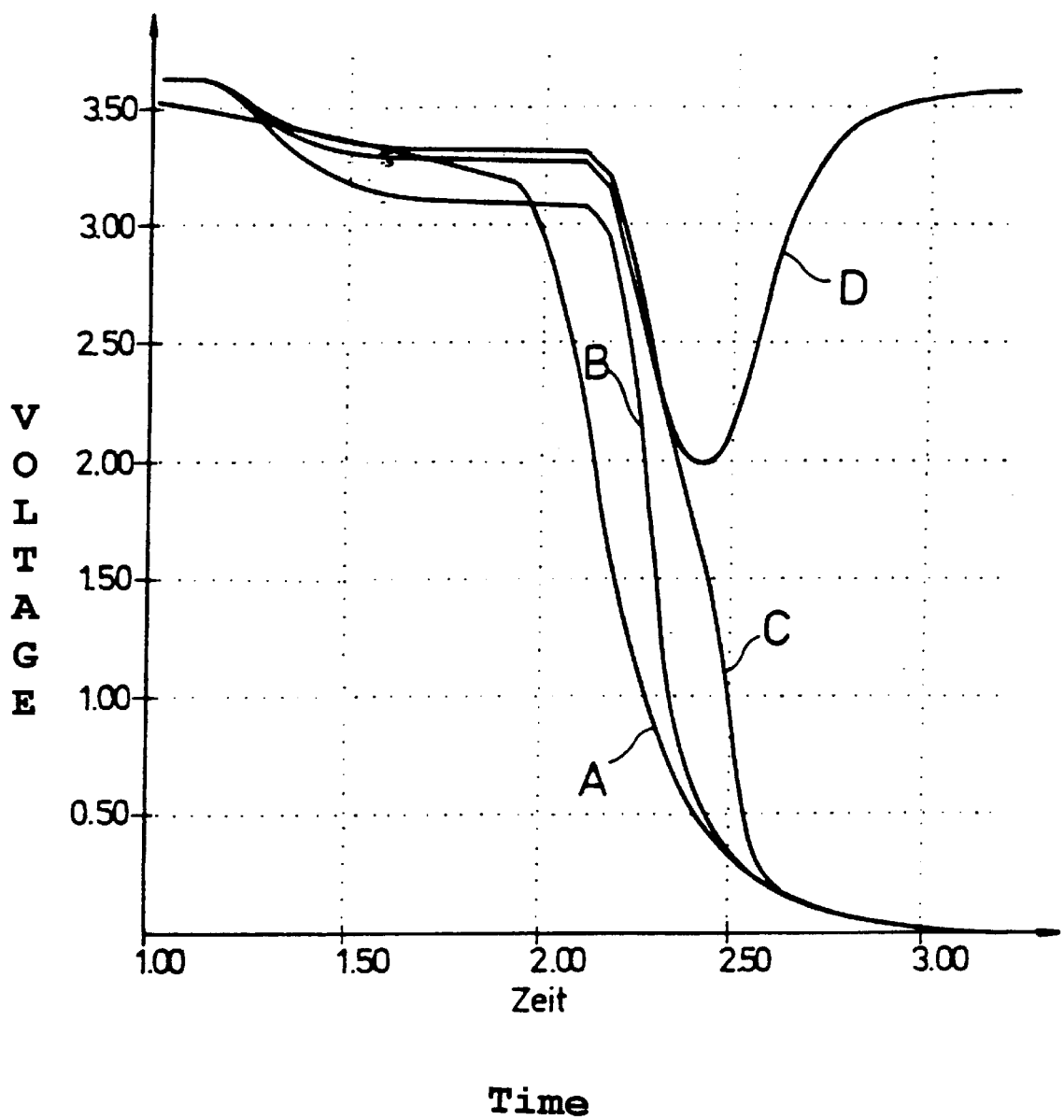

CIRCUIT APPARATUS FOR EVALUATING THE DATA CONTENT OF MEMORY CELLS

BACKGROUND OF THE INVENTION

FIELD OF THE INVENTION

The invention relates to a circuit apparatus for evaluating the data content of memory cells of an integrated semiconductor memory, which memory cells are disposed along bit lines and word lines.

The recovery of information from a memory cell constitutes a significant problem in the course of development and during operation of a DRAM. On the one hand, the information in a cell is represented by an extremely small capacitance. On the other hand, the capacitance is often reduced further by a wide variety of influences. It is necessary to amplify the small amount of charge such that the correct information can be reconstructed.

In many configurations known to date, the interference produced on account of capacitive coupling in the course of assessing the cell signal (sensing) on the neighboring bit lines is tolerated. However, the configurations require a larger cell capacitance. Other configurations use so-called twisted bit lines, but they take up valuable chip space.

SUMMARY OF THE INVENTION

It is accordingly an object of the invention to provide a circuit apparatus for evaluating the data content of memory cells which overcomes the above-mentioned disadvantages of the prior art devices of this general type, in which reliable evaluations of even weak memory cell data are enabled without increasing the cell capacitance or with the use of specially configured bit lines which require additional chip space.

With the foregoing and other objects in view there is provided, in accordance with the invention, in an improved integrated semiconductor memory having bit lines, word lines and memory cells disposed along the bit lines and the word lines, the improvement including: a circuit apparatus for evaluating a data content of the memory cells, the circuit apparatus having a voltage compensation device with voltage compensation elements voltage coupling in each case two neighboring bit lines.

According to the invention, provision is made of a voltage compensation device having voltage compensation elements which are connected for the purpose of voltage coupling of in each case two neighboring bit lines. Following the principle of the invention, the voltage compensation element has, in particular, an electrical compensation resistor assigned to the two bit lines. In a preferred configuration, the voltage compensation element is constructed and/or disposed and/or controlled in such a way that the compensation voltage drop across the voltage compensation element is set such that a very weak ZERO or a very weak ONE as the data content of a relevant memory cell is still evaluated as a digital ZERO or digital ONE by the circuit apparatus.

In this case, the voltage compensation elements advantageously have transistors, whose first electrode terminals (drain and source) are coupled to neighboring bit lines and whose second electrode terminals (drain and source) are jointly connected to the electrical compensation resistor. It is advantageous for the transistors of the voltage compensation elements simultaneously to be part of the sense amplifier device. Following the principle of the invention, the voltage compensation element is set in such a way that the voltage compensation yields good results for all possible bit patterns on the bit lines.

In accordance with an added feature of the invention, each of the voltage compensation elements has an electrical compensation resistor associated with the two neighboring bit lines.

In accordance with an additional feature of the invention, there is a sense amplifier device, and each of the bit lines having a pair of complementary bit line halves jointly connected to the sense amplifier device.

In accordance with another feature of the invention, the voltage compensation elements are alternately connected to the complementary bit line halves of the bit lines.

In accordance with a further added feature of the invention, the sense amplifier device has transistors and the voltage compensation elements have transistors serving simultaneously as the transistors of the sense amplifier device.

In accordance with a further additional feature of the invention, each of the memory cells has a cell capacitor and a selection transistor connected to the cell capacitor, the selection transistor has an electrode terminal (drain and source) connected to the bit line half and the selection transistor has a control terminal (gate) connected to one of the word lines.

In accordance with a concomitant feature of the invention, the sense amplifier device has a p-channel sense amplifier and an n-channel sense amplifier.

Other features which are considered as characteristic for the invention are set forth in the appended claims.

Although the invention is illustrated and described herein as embodied in a circuit apparatus for evaluating the data content of memory cells, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a graph of a voltage profile with respect to time during a reading of a weak ZERO with the circuit apparatus shown in FIGS. 1A or 1B;

FIG. 5 is graph of the simulation of the evaluation of a weak ZERO of the circuit apparatus.

DESCRIPTION OF THE PREFERRED EMBODIMENTS

Figure 3:
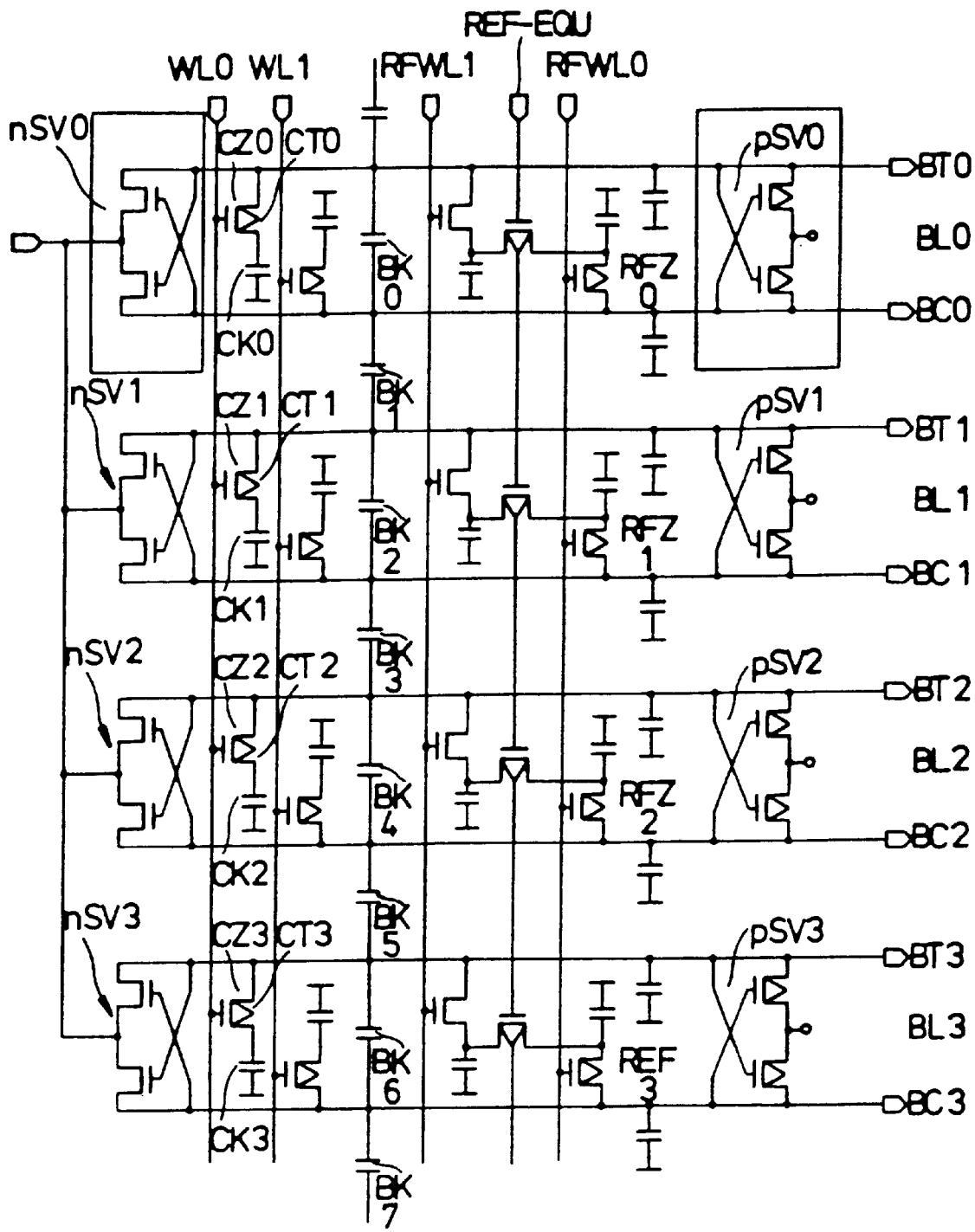
FIG. 3 is a schematic diagram of the cell array of a prior art DRAM semiconductor memory device.

Referring now to the figures of the drawing in detail and first, particularly, to FIG. 3 thereof, there is shown a known circuit apparatus of a generic type which shows a cell array of a prior art DRAM semiconductor memory. Four bit line pairs BL0, BL1, BL2, BL3, each having true bit line halves BT0, BT1, BT2, BT3 and complement bit line halves BC0, BC1, BC2, BC3, are shown. Each memory cell CZ0, CZ1, CZ2, CZ3 has a cell capacitor CK0, CK1, CK2, CK3 which is respectively connected to a selection transistor CT0, CT1, CT2, CT3 through which the charges pass in and out. In this case, each of the cell capacitors Ck0–4 is connected by the selection transistor CT0–4 to the corresponding bit line half, via a drain terminal or a source terminal of the selection transistor, and to a word line via a gate terminal the selection transistor. Each selection transistor CT is switched on and off by a corresponding word line WL0, WL1, . . . WL255 and the word line always corresponds to a bit line half.

Each bit line pair includes a p-channel sense amplifier pSV and an n-channel sense amplifier nSV. The sense amplifiers serve the purpose of amplifying the cell signal, switched to the corresponding bit line half following activation of the corresponding word line WL, in such a way that a ONE and a ZERO can be unambiguously distinguished. The information from and to the cell flows via the bit line to which the selection transistor is also connected. There are no problems in the course of writing since, in this case, the charge offered to the cell by the voltage supply is always at a maximum. In the course of reading, the cell is then connected to the bit line. The charge ratios on just the bit line change as a result. Activation of the sense amplifiers pSV and nSV then result in a change in the charge being amplified in such a way that a ONE or ZERO becomes identifiable. With the activation of the word line, all the cells of the word line are connected to the associated bit lines. Consequently, the voltage on the bit line is influenced by the charge flowing from the cell onto the bit line. The influence on the bit line voltage is very small in accordance with the capacitance ratio between the cell and the bit line (about 1:5). Parasitic BL—BL capacitances BK0, BK1, BK2, BK3, BK4, BK5, BK6, BK7 exist between all the bit lines.

Figure 4:
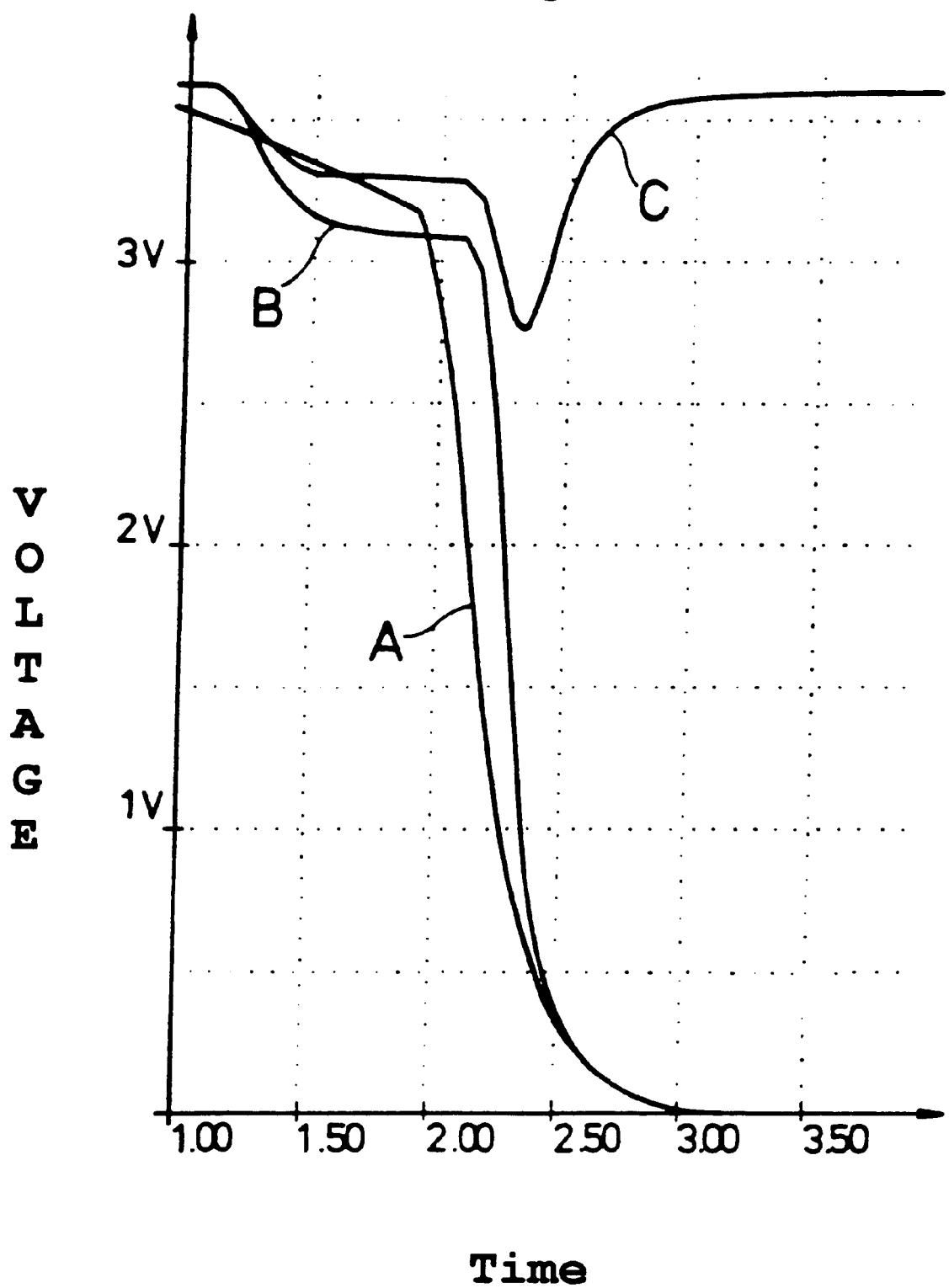
FIG. 4 is a graph of a simulation of an evaluation of a normal ZERO.

A reading operation is now described. During a precharge time, the bit lines are precharged to a defined voltage, for example to VDD=3.6 V. Afterwards, the word line is activated in the course of the reading process, for example the word line WL0. Let us assume that the cells CZ0, CZ1, CZ2 and CZ3 all contained ZEROS. The normal voltage for a ZERO is 1.2 V, for example, and the normal voltage for a ONE is 3.6 V. The normal voltage of a reference cell RFZ is then about 2.6 V. It will now be assumed below that the cell CZ2 is a weak cell, for example caused by a high leakage current, and therefore has a ZERO voltage of 2.2 V (given a different assumption, the capacitance of the cell CZ2, for example, would be slightly less than the average cell capacitance and such an assumption would lead to similar results). FIG. 4 shows a simulation of the evaluation (reading) of a normal ZERO (1.2 V) and FIG. 5 shows the simulation of the evaluation of a weak ZERO (2.2 V) of the cell CZ2. The profile of the voltage in volts as a function of time (arbitrary units) is illustrated in each case. The curve A shows the voltage profile of the signal SETN, which starts the evaluation. The curve B shows the voltage profile of the bit lines BT0, BT1, BT3 which are connected to a cell in which a normal zero (1.2 V) is stored. The curve C shows the voltage profile of the bit lines BC0, BC1, BC3 which are connected to the reference cells RFZ0, RFZ1, RFZ3 (2.6 V). In FIG. 5, the curve D shows the voltage profile of the bit line BT2 which is connected to the cell CZ2 in which a weak ZERO (2.2 V) is stored. It is evident from the simulation according to FIG. 5 that the weak ZERO of the cell CZ2 is evaluated incorrectly since the bit line BT2 goes high to 3.6 V during the evaluation even though the voltage of the reference cell RFZ2 is 0.4 volts larger (2.6 V). The reason for the incorrect evaluation lies in the parasitic BL—BL capacitances BK. According to FIG. 5, during the evaluation the bit line BT3 draws to a certain extent via the parasitic BL—BL capacitance BK5 on the bit line BC2. As a result, a negative voltage is coupled onto the bit line BC2 and causes the voltage of BC2 to fall below the voltage of BT2, ultimately producing an incorrect evaluation.

Figure 1A:
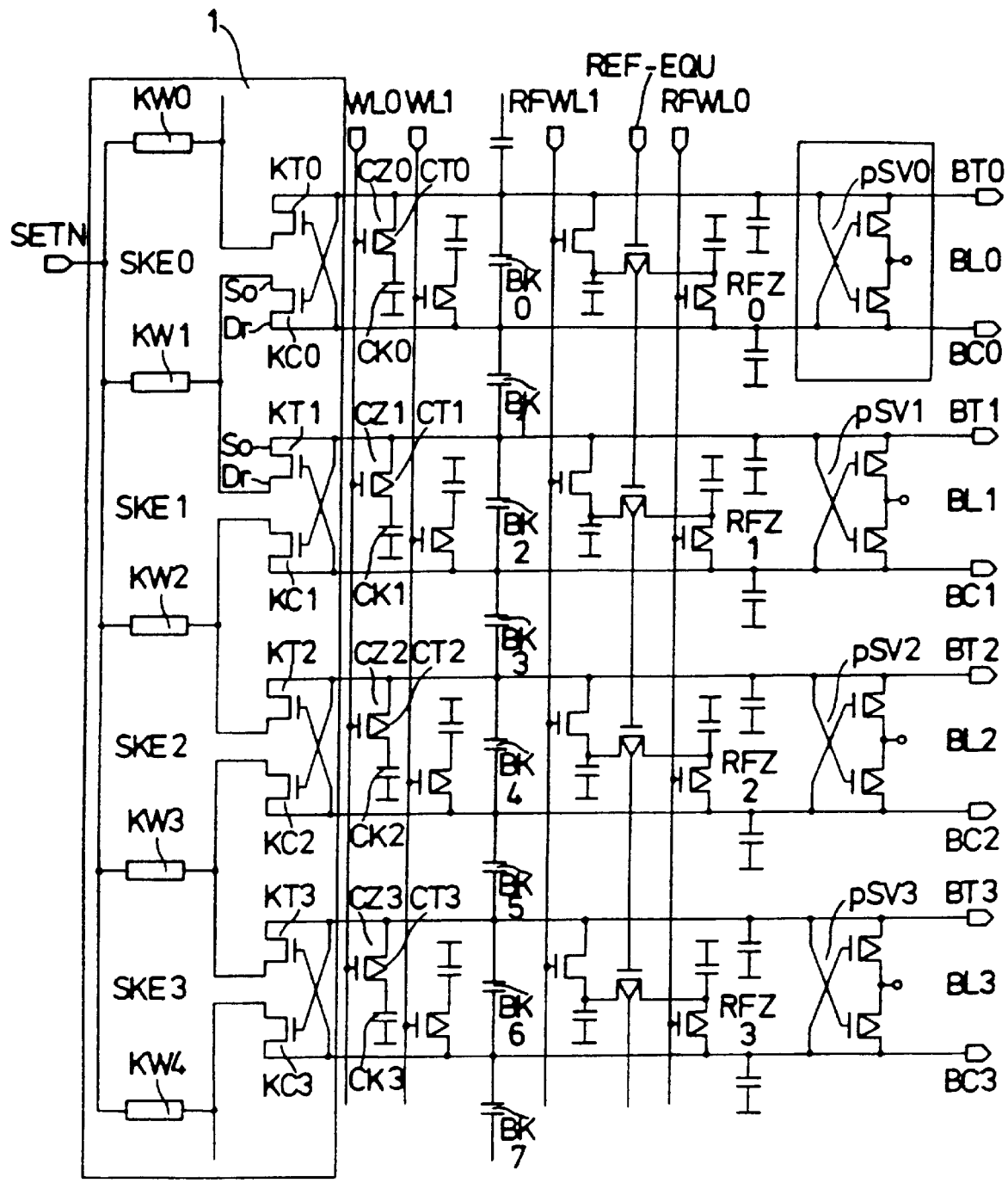
FIG. 1A is a schematic diagram of a cell array of a synchronous RAM semiconductor memory device having a circuit apparatus for evaluating a data content of memory cells according to a first exemplary embodiment of the invention.
Figure 1B:
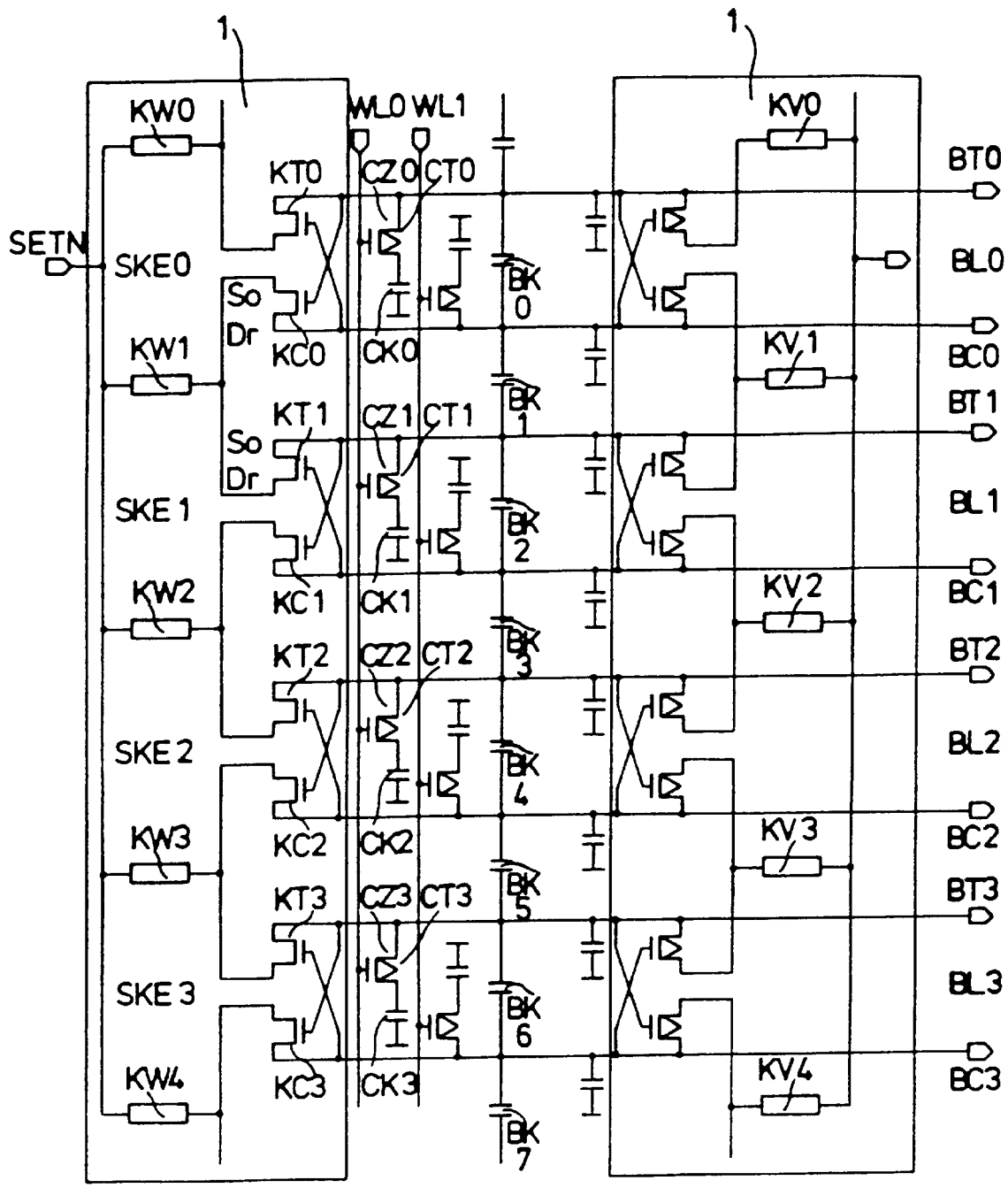
FIG. 1B is a,schematic diagram of the cell array of the synchronous DRAM semiconductor memory device having the circuit apparatus according to a second exemplary embodiment.

A circuit apparatus according to the invention is shown in FIGS. 1A and 1B in which identical reference symbols designate the same components as in the circuit described in the introduction in accordance with FIG. 3. In contrast to the configuration according to FIG. 3, and in accordance with the essence of the invention, the circuit apparatus according to FIGS. 1A or 1B has a compensation device 1 with voltage compensation elements SKE0, SKE1, SKE2, SKE3. The compensating elements SKE0–3 are connected for the purpose of voltage coupling in each case two neighboring bit lines as illustrated. The voltage compensation element SKE1 has an electrical compensation resistor KW1 assigned to the two successive, neighboring bit lines BL1 and BL0. Transistors KC0 and KT1, whose first electrode terminals (drain of KC0 and source of KT1) are coupled to neighboring bit lines and whose second electrode terminals (drain KT1 and source KC0) are jointly connected to the electrical compensation resistor KW1. In particular an n-channel enhancement-mode MOSFET transistor KT1 is provided which is assigned to the bit line BL1, and whose source terminal So is connected to the associated true bit line half BT1. The drain terminal Dr of the transistor KT1 is connected to the resistor KW1, and a gate terminal Ga is connected to the complementary complement bit line half BC1. All of the n-channel enhancement-mode MOSFET transistors KT and KC in each case have a threshold voltage of about 0.6 V. The voltage compensation elements SKE0, SKE2 and SKE3 are analogously connected to their respective bit lines.

The method of operation of the circuit apparatus according to the invention as shown in FIG. 1 emerges from the schematic illustration of the evaluation of a weak ZERO in accordance with FIG. 2. The curve A again shows the voltage profile of the signal SETN, curve B shows the voltage profile measured on the bit lines BT1 and BT3, curve C shows the voltage profile measured on the bit line BC2, and curve D shows the voltage profile of the bit line BT2 which is connected to the memory cell CZ2 in which the weak ZERO (2.2 V) is stored. As is evident from FIG. 2, the weak ZERO of the memory cell CZ2 (2.2 V cell voltage) is now evaluated correctly. That is to say the bit line BT2 goes to zero volts. During the evaluation the bit line BT3 now also draws via the parasitic BL—BL capacitance BK5 on the bit line BC2. In the circuit apparatus according to the invention, the current flows from the bit line BT3 through the transistor KT3 and thus through the resistor KW3 and causes a voltage drop across the latter. The voltage drop leads to a reduction in the gate-source voltage of transistor KC2 and compensates for the negative voltage which is coupled from BT3 to BC2 (via BK5) and leads to a reduction in the gate-source voltage of transistor KT2. The resistor KW3, and accordingly the resistors KW2, KW1, etc., must thus be dimensioned in such a way that the current flowing during the evaluation causes a voltage drop across it, which voltage drop compensates, but does not overcompensate, for the voltage coupled in via the parasitic BL—BL capacitance BK5. Overcompensation would be present if the weak ONE (2.7 V cell voltage given a reference cell voltage of 2.6 V) were evaluated as ZERO.

The voltage compensation explained above should yield good results for all possible bit patterns on the bit lines. Table 1 shows possible bit patterns relative to the bit line BT2 according to FIG. 1:

| Number | BC3 | BT3 | BC2 | BT2 | BC1 | BT1 |
|--------|-----|-----|-----|-----|-----|-----|
| 1.     | ½   | 0   | ½   | "0" | ½   | 0   |
| 2.     | ½   | 0   | ½   | "0" | ½   | 1   |
| 3.     | ½   | 1   | ½   | "0" | ½   | 0   |
| 4.     | ½   | 1   | ½   | "0" | ½   | 1   |
| 5.     | ½   | 0   | ½   | "1" | ½   | 0   |
| 6.     | ½   | 0   | ½   | "1" | ½   | 1   |
| 7.     | ½   | 1   | ½   | "1" | ½   | 0   |
| 8.     | ½   | 1   | ½   | "1" | ½   | 1   |

In this case, 0, "0", ½, 1, "1" as used in the table denote the following:

0 defines a cell containing a ZERO is connected to the relevant bit line half.

"0" defines a cell containing a weak ZERO is connected to the relevant bit line half (BT2).

½ defines a reference cell is connected to the relevant bit line half.

1 defines a cell containing a ONE is connected to the relevant bit line half.

"1" defines a cell containing a weak ONE is connected to the relevant bit line half (BT2).

The bit pattern 1. according to table 1 corresponds to the case investigated extensively above, for which the capacitive BL—BL interference was compensated for by the circuit apparatus according to FIG. 1. In the case of the bit pattern 2., the capacitive BL—BL interference on the bit line 2 is neutralized since the interference from BT3 on BC2 is equal to the interference from BC1 on BT2 (BT3 and BC1 go to zero). In the case of the bit pattern 3., the capacitive BL—BL interference on the bit line 2 is likewise neutralized or is approximately zero (BT3 and BC1 remain at one). The bit pattern 4. behaves similarly to the bit pattern 1. The "interference" of BC1 on BT2 (BC1 goes to zero and helps the weak ZERO on BT2) is compensated for. Similar correlations apply to the bit patterns 5. to 8.

The circuit apparatus according to FIGS. 1A or 1B thus compensates for the capacitive coupling between neighboring bit lines during the evaluation by providing voltage drops across resistors which are configured according to FIGS. 1A or 1B.

Even very weak ZEROS (cell voltage 2.5 V or less) are also evaluated correctly by the invention. The same applies to weak ONES. The cell voltage gain amounts to about 0.4 V. The difference voltage between a strong ZERO (1.2 V) and the reference cell voltage (2.6 V) is 1.4 V. Only 0.9 V of this is usable, however, with the circuit apparatus according to FIG. 3 (the zero already fails at a cell voltage of 2.2 V in the case of the circuit apparatus according to FIG. 3). In contrast, the circuit apparatus according to the invention as shown in FIG. 1 enables the usable voltage range to be increased to 1.3 V. The ZERO is evaluated correctly even at 2.5 V. The usable voltage range is thus increased by about 44%, the value depending on the size of the parasitic BL—BL capacitance and the size of the parasitic bit line capacitance. The larger the ratio of the parasitic BL—BL capacitance to the parasitic bit line capacitance, the greater the improvement in evaluation that can be obtained by voltage compensation.

In the exemplary embodiment illustrated in FIG. 1A, each bit line is assigned reference cells RFZ, to be precise in each case for a group of, for example 256 word lines WL0 to WL255. The reference cells RFZ serve, in a manner known per se, for setting an average reference voltage during the reading operation by the sense amplifiers. The voltage compensation circuit according to the invention can also be used, in a configuration that is slightly modified if appropriate, in constructions in which the bit lines are precharged only to half the array voltage (for example VDD/2) and in which, therefore, no reference cells are necessary. Such a construction is shown by FIG. 1B. In this case, the p-type sense amplifier participates "actively" in the evaluation and brings one of the bit lines (BT or BC) from e.g. VDD/2 to VDD during the evaluation. The resistors KV0, KV1, KV2, KV3 in this case ensure, in a similar manner to the resistors KW1, . . . , compensation of the voltages which are coupled in via the parasitic BL—BL capacitances.

As a further advantage, the cell capacitances could be reduced in an application of the voltage compensation configuration according to the invention. Alternatively, an improved retention time could be obtained given an unchanged cell capacitance.

We claim:

1. In an integrated semiconductor memory having bit lines, each bit line having a first bit line half and a complimentary second bit line half, word lines, and memory cells disposed along the bit lines and the word lines, a circuit apparatus for evaluating a data content of the memory cells, comprising:

a voltage compensation device with voltage compensation elements said voltage compensation elements connecting the bit line half of the first bit line and the complementary bit line half of the second bit line.

2. The circuit apparatus according to claim 1, wherein each of said voltage compensation elements has an electrical compensation resistor associated with the two neighboring bit lines.

3. The circuit apparatus according to claim 1, wherein each of said voltage compensation elements is configured for setting a compensating voltage drop across said voltage compensation elements so that a very weak ZERO and a very weak ONE as the data content of a relevant memory cell are evaluated as a digital ZERO and digital ONE respectively.

4. The circuit apparatus according to claim 2, wherein said electrical compensation resistor has an end and said voltage compensation elements have transistors with first electrode terminals coupled to the neighboring bit lines and second electrode terminals jointly connected to said end of said electrical compensation resistor.

5. The circuit apparatus according to claim 1, including a sense amplifier device, said sense amplifier device being connected to a pair of complementary bit line halves of a single bit line.

6. The circuit apparatus according to claim 5, wherein said sense amplifier device has transistors and said voltage compensation elements have transistors serving simultaneously as said transistors of said sense amplifier device.

7. The circuit apparatus according to claim 5, wherein each of the memory cells has a cell capacitor and a selection transistor connected to said cell capacitor, said selection transistor has an electrode terminal connected to one of the complementary bit line halves and said selection transistor has a control terminal connected to one of the word lines.

8. The circuit apparatus according to claim 5, wherein said sense amplifier device has a p-channel sense amplifier and an n-channel sense amplifier.

9. The circuit apparatus according to claim 1, wherein each of said voltage compensation elements is configured, disposed and controlled for setting a compensating voltage drop across said voltage compensation elements so that a very weak ZERO and a very weak ONE as the data content of a relevant memory cell are evaluated as a digital ZERO and digital ONE respectively.

10. The circuit apparatus according to claim 1, wherein each of said voltage compensation elements is controlled to set a compensating voltage drop across said voltage compensation elements so that a very weak ZERO and a very weak ONE as the data content of a relevant memory cell are evaluated as a digital ZERO and digital ONE respectively.

11. The circuit apparatus according to claim 1, wherein each of said voltage compensation elements is disposed for setting a compensating voltage drop across said voltage compensation elements so that a very weak ZERO and a very weak ONE as the data content of a relevant memory cell are evaluated as a digital ZERO and digital ONE respectively.

* * * * *